US010258127B2

(12) United States Patent
Johnson et al.

(10) Patent No.: US 10,258,127 B2
(45) Date of Patent: Apr. 16, 2019

(54) PROTECTIVE CASE FOR PORTABLE ELECTRONIC DEVICE

(71) Applicant: Otter Products, LLC, Fort Collins, CO (US)

(72) Inventors: Jamie L. Johnson, Fort Collins, CO (US); Stephen Willes, Salt Lake City, UT (US); W. Travis Smith, Fort Collins, CO (US); Jonathan Watt, Colorado Springs, CO (US)

(73) Assignee: Otter Products, LLC, Fort Collins, CO (US)

(*) Notice: Subject to any disclaimer, the term of this patent is extended or adjusted under 35 U.S.C. 154(b) by 0 days.

(21) Appl. No.: 15/783,520

(22) Filed: Oct. 13, 2017

(65) Prior Publication Data
US 2018/0049526 A1 Feb. 22, 2018

Related U.S. Application Data

(63) Continuation of application No. 15/444,477, filed on Feb. 28, 2017, now Pat. No. 10,016,039, which is a (Continued)

(51) Int. Cl.
A45C 13/00 (2006.01)
H05K 5/02 (2006.01)
(Continued)

(52) U.S. Cl.
CPC ............ *A45C 13/002* (2013.01); *A45C 11/00* (2013.01); *A45C 13/005* (2013.01); *A45F 5/00* (2013.01);
(Continued)

(58) Field of Classification Search
CPC .............. A45C 11/00; A45C 2011/002; A45C 2011/003; G06F 1/1628
(Continued)

(56) References Cited

U.S. PATENT DOCUMENTS 5,632,373 A 5/1997 Kumar et al.
5,966,647 A 10/1999 Sawai
(Continued)

FOREIGN PATENT DOCUMENTS

WO 1994000037 A1 1/1994
WO 1999041958 A1 8/1999

*Primary Examiner* — Binh B Tran
*Assistant Examiner* — Douglas R Burtner

(57) ABSTRACT

A case for protecting a portable electronic device includes a first member, a second member, and a flexible hinge member. The first member is removably attachable to a first portion of the portable electronic device for covering an outer surface of the first portion of the portable electronic device while not covering a display screen area of the portable electronic device. The second member of the case is removably attachable to a second portion of the portable electronic device for covering the outer surface of the second portion of the portable electronic device while not covering the display. The flexible hinge member is in proximity to a hinging portion of the portable electronic device when the case is attached. The flexible hinge member permits articulation of the portable electronic device when the case is attached to the portable electronic device due to flexing of a flexible material.

18 Claims, 13 Drawing Sheets

Related U.S. Application Data continuation of application No. 14/671,701, filed on Mar. 27, 2015, now Pat. No. 9,703,330, which is a continuation of application No. 13/050,791, filed on Mar. 17, 2011, now Pat. No. 9,025,317.

(60) Provisional application No. 61/317,537, filed on Mar. 25, 2010, provisional application No. 61/314,954, filed on Mar. 17, 2010.

(51) Int. Cl.

| | | |
|---|---|---|
| *H04M 1/02* | (2006.01) | |
| *H04M 1/18* | (2006.01) | |
| *A45C 11/00* | (2006.01) | |
| *G06F 1/18* | (2006.01) | |
| *A45F 5/00* | (2006.01) | |
| *B29C 45/00* | (2006.01) | |
| *B29C 45/16* | (2006.01) | |
| *H05K 5/00* | (2006.01) | |
| *H05K 5/03* | (2006.01) | |
| *B29L 31/34* | (2006.01) | |

(52) U.S. Cl.
CPC ...... *B29C 45/0081* (2013.01); *B29C 45/1676* (2013.01); *G06F 1/181* (2013.01); *H04M 1/0252* (2013.01); *H04M 1/185* (2013.01); *H05K 5/0004* (2013.01); *H05K 5/0217* (2013.01); *H05K 5/0226* (2013.01); *H05K 5/03* (2013.01); *A45C 2011/001* (2013.01); *A45C 2011/002* (2013.01); *A45C 2011/003* (2013.01); *B29K 2995/007* (2013.01); *B29L 2031/3481* (2013.01)

(58) Field of Classification Search
USPC ............... 206/320; 220/4.22, 4.23, 837, 847
See application file for complete search history.

(56) References Cited

U.S. PATENT DOCUMENTS

| | | | | |
|---|---|---|---|---|
| 6,109,434 | A * | 8/2000 | Howard, Jr. ......... | G06F 1/1601 206/320 |
| 6,267,236 | B1 * | 7/2001 | Seok .................... | A45C 13/002 206/320 |
| 7,444,176 | B2 | 10/2008 | Oda et al. | |
| 7,609,512 | B2 | 10/2009 | Richardson et al. | |
| 7,850,032 | B2 * | 12/2010 | Carnevali ............. | B63B 49/00 206/315.11 |
| 7,933,122 | B2 * | 4/2011 | Richardson .......... | H05K 5/0017 361/679.55 |
| 8,261,933 | B2 * | 9/2012 | Kidd ..................... | B65D 75/22 220/324 |
| 8,965,458 | B2 | 2/2015 | Richardson et al. | |
| 9,025,317 | B2 | 5/2015 | Richardson et al. | |
| 9,703,330 | B2 * | 7/2017 | Johnson ............... | H04M 1/0252 |
| 9,735,595 | B2 | 8/2017 | Colahan et al. | |
| 2002/0065054 | A1 | 5/2002 | Humphreys et al. | |
| 2003/0095374 | A1 | 5/2003 | Richardson | |
| 2003/0114184 | A1 * | 6/2003 | Wilson ................. | H04M 1/0216 455/550.1 |
| 2004/0180706 | A1 * | 9/2004 | Pan ...................... | H04M 1/0214 455/575.3 |
| 2004/0256535 | A1 * | 12/2004 | Desch .................. | A47B 23/042 248/460 |
| 2004/0262179 | A1 * | 12/2004 | Gartrell ................ | A45C 11/00 206/320 |
| 2005/0045505 | A1 * | 3/2005 | Vandevenne .......... | A45C 5/03 206/320 |
| 2005/0139498 | A1 | 6/2005 | Goros | |
| 2006/0175370 | A1 * | 8/2006 | Arney ................... | A45F 5/02 224/666 |
| 2006/0177048 | A1 * | 8/2006 | Tsutaichi ............. | H01R 13/5213 379/433.13 |
| 2007/0205122 | A1 * | 9/2007 | Oda ..................... | H04M 1/0216 206/320 |
| 2008/0032758 | A1 * | 2/2008 | Rostami ............... | A45C 11/00 455/575.8 |
| 2008/0053851 | A1 * | 3/2008 | Ko ....................... | A45C 11/00 206/320 |
| 2008/0083631 | A1 * | 4/2008 | Tsang .................. | A45C 11/18 206/320 |
| 2008/0121321 | A1 * | 5/2008 | Tiner ................... | A45C 1/06 150/131 |
| 2008/0125197 | A1 * | 5/2008 | Hongo ................ | H04M 1/0216 455/575.3 |
| 2008/0302687 | A1 * | 12/2008 | Sirichai ................ | A45F 5/02 206/320 |
| 2009/0009945 | A1 * | 1/2009 | Johnson ............... | G06F 1/1613 361/679.27 |
| 2009/0032421 | A1 * | 2/2009 | Sween .................. | A45C 3/02 206/320 |
| 2009/0034169 | A1 | 2/2009 | Richardson et al. | |
| 2009/0050499 | A1 | 2/2009 | Calco et al. | |
| 2009/0080153 | A1 * | 3/2009 | Richardson .......... | H05K 5/0017 361/679.56 |
| 2009/0194445 | A1 * | 8/2009 | Mongan ............... | A45C 13/021 206/320 |
| 2009/0233658 | A1 | 9/2009 | Murayama et al. | |
| 2009/0236246 | A1 * | 9/2009 | Ai ........................ | G06F 1/1616 206/320 |
| 2009/0314400 | A1 * | 12/2009 | Liu ....................... | A45C 11/00 150/165 |
| 2010/0096284 | A1 | 4/2010 | Bau | |
| 2010/0110629 | A1 * | 5/2010 | Dietz .................... | A45C 11/00 361/679.55 |
| 2010/0122924 | A1 * | 5/2010 | Andrews .............. | A45C 9/00 206/320 |
| 2010/0238119 | A1 | 9/2010 | Dubrovsky et al. | |
| 2011/0157800 | A1 | 6/2011 | Richardson et al. | |
| 2011/0228459 | A1 * | 9/2011 | Richardson .......... | H04M 1/185 361/679.01 |
| 2012/0043234 | A1 * | 2/2012 | Westrup ............... | A45C 3/02 206/320 |
| 2012/0088557 | A1 * | 4/2012 | Liang ................... | G06F 1/1628 455/575.1 |
| 2012/0154288 | A1 * | 6/2012 | Walker ................. | G06F 1/1616 345/169 |
| 2012/0261304 | A1 * | 10/2012 | Busri .................... | A45C 11/00 206/736 |
| 2014/0262875 | A1 | 9/2014 | Carnevali | |
| 2015/0257285 | A1 | 9/2015 | Wilson et al. | |
| 2016/0234951 | A1 | 8/2016 | Chen et al. | |
| 2016/0299532 | A1 | 10/2016 | Gheorghiu et al. | |
| 2017/0250719 | A1 | 8/2017 | Stryker et al. | |
| 2017/0257961 | A1 | 9/2017 | Chen et al. | |

\* cited by examiner

PROTECTIVE CASE FOR PORTABLE ELECTRONIC DEVICE

CROSS REFERENCE TO RELATED APPLICATIONS

This application is a continuation of U.S. patent application Ser. No. 15/444,477, filed Feb. 28, 2017, which claims priority to U.S. patent application Ser. No. 14/671,701, filed Mar. 27, 2015, now U.S. Pat. No. 9,703,330, which claims priority to U.S. patent application Ser. No. 13/050,791, filed Mar. 17, 2011, now U.S. Pat. No. 9,025,317, which claims priority to U.S. Provisional Patent Application 61/317,537, filed Mar. 25, 2010, and to U.S. Provisional Patent Application 61/314,954, filed Mar. 17, 2010, all of which are hereby incorporated by reference in their entireties.

BACKGROUND

Protective cases and covers for handheld electronic devices, such as various types of MP3 players, video players, cell phones, smart phones, satellite phones, walkie talkies, GPS navigational devices, telematics devices, pagers, monitors, personal data assistants, bar code scanners, as well as various types of computers, including portable computers, laptop computers, handheld computers, ultra-mobile computers, tablet computers, and various hybrid devices that combine two or more of these functions, provide a valuable function in preventing damage to these handheld electronic devices. Various types of protective cases are available that provide a varying amount of protection.

SUMMARY

In one example, a case for protecting a portable electronic device includes a first member, a second member, and a flexible hinge member. The portable electronic device comprises at least a first portion and a second portion. The second portion of the portable electronic device is hingedly attached to the first portion with a hinging portion such that the second portion of the portable electronic device is permitted to articulate relative to the first portion. Each of the first and second portions of the portable electronic device, respectively, have an outer surface and a display screen area. The first member of the case is removably attachable to the first portion of the portable electronic device for covering at least a portion of the outer surface of the first portion of the portable electronic device while not covering the display screen area of the first portion of the portable electronic device. The second member of the case is removably attachable to the second portion of the portable electronic device for covering at least a portion of the outer surface of the second portion of the portable electronic device while not covering the display screen area of the second portion of the portable electronic device. The flexible hinge member is in proximity to the hinging portion of the portable electronic device when the first and the second members of the case are attached to the first and second portions of the portable electronic device, respectively. The flexible hinge member permits articulation of the portable electronic device when the case is attached to the portable electronic device due to flexing of a flexible material that comprises the flexible hinge member.

In another example, a protective case or cover for an electronic device includes a first hardshell member, a second hardshell member, and a flexible hinge. The electronic device has at least a first portion and a second portion where the second portion is connected to the first portion through a hinging structure such that the second portion articulates relative to the first portion. The first hardshell member of the protective cover removably attaches to the first portion of the electronic device to protect at least one surface of the first portion of the electronic device. The second hardshell member removably attaches to the second portion of the electronic device to protect at least one surface of the second portion of the electronic device. The flexible hinge comprises a flexible material, such as an elastomer, and is attached to the first hardshell member and the second hardshell member such that the flexible hinge of the protective cover aligns with the hinging structure of the electronic device. The flexible hinge of the protective cover flexes to allow the second portion of the electronic device to remain articulable relative to the first portion of the electronic device when the protective cover is installed on the electronic device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Many electronic devices are constructed with two pieces that may be joined by hinges or various sliding mechanisms. Examples of such devices may be hand held mobile telephones, portable gaming devices, laptop computer, netbook computers, or other devices.

A protective cover or outer shell for these devices may be constructed with two hard shell components, one for the front portion of the electronic device and one for the rear portion. A silicone or other flexible component may be held by one or both of the hard shell components.

In some embodiments, the flexible component may be held by only one of the hard shell components. In an example of such an embodiment, the flexible component may be installed underneath the rear hard shell component.

In some embodiments, the flexible component may be held or retained by both hard shell components. In an example of such an embodiment, the flexible component may be retained by both hard shell components and the flexible component may have a portion that covers a hinge or other mechanism that may join the two portions of the electronic device.

The flexible component may have pads or other mechanisms that may allow a user to active a button on the electronic device when the cover is installed. Some embodiments may have removable covers for earphone ports or other electrical connectors as well.

In some embodiments, the protective cover may be a removable cover that may be installed and removed by a consumer. In such embodiments, the protective cover may have logos, colors, or other designs that allow a user to personalize their electronic device. In such embodiments, the protective cover may have snaps or other engagement mechanisms that may be easily installed and removed by a consumer.

In other embodiments, the protective cover may not be a consumer installed cover. In such embodiments, the protective cover may be installed by the manufacturer of the electronic device and may be an integral part of the electronic device. In such embodiments, the protective cover may be installed using fasteners, adhesives, snaps, or other mechanisms for which a typical consumer may not have access or ability to install or remove.

Figure 1:
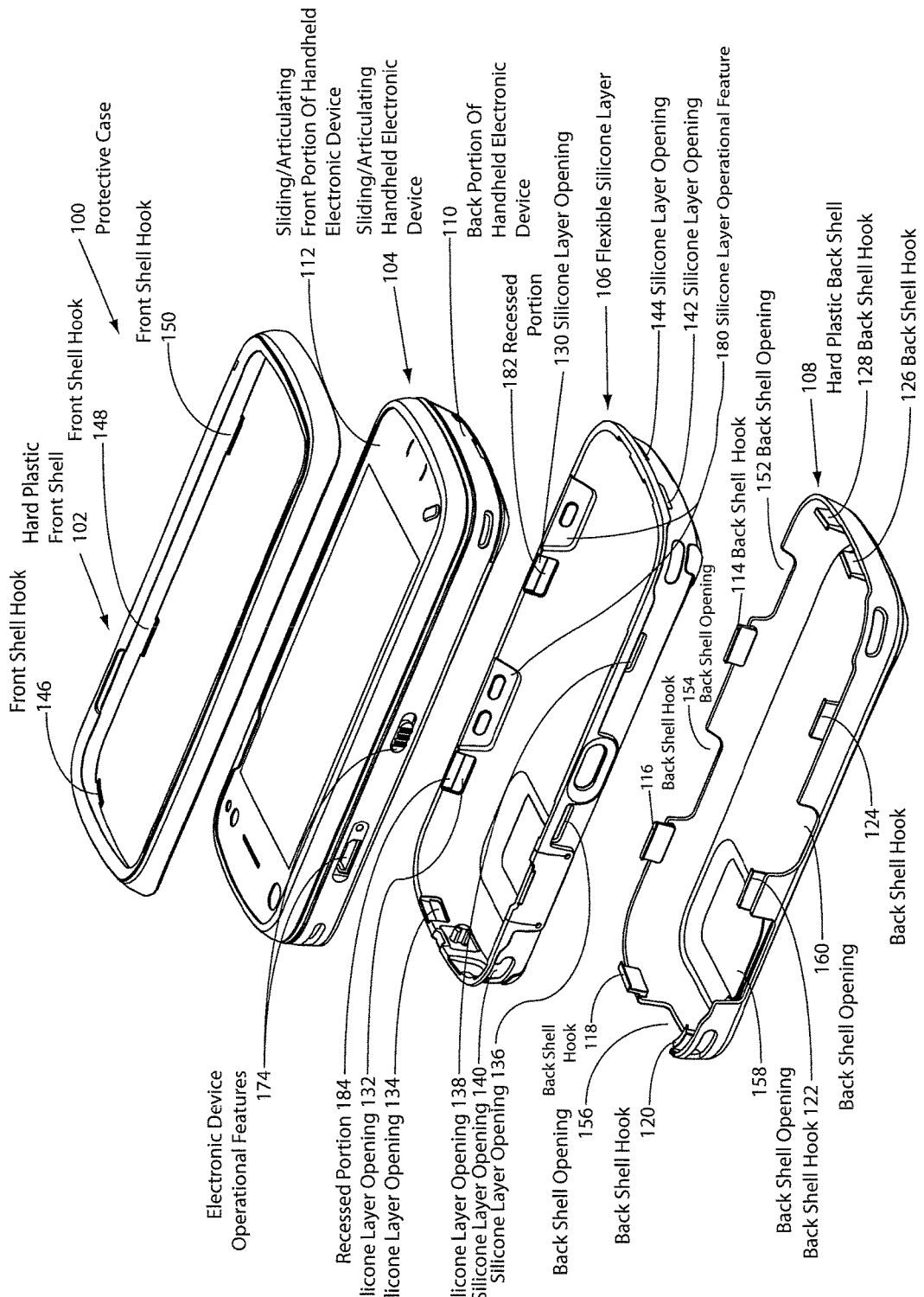
FIG. 1 is an exploded view of an embodiment of a protective case and a sliding/articulating handheld electronic device.

FIG. 1 is a perspective view of a protective case 100 and a sliding/articulating handheld electronic device 104. Many handheld electronic devices have a back portion 110 and a front sliding/articulating front portion 112. Mobile phones, for example, may have a sliding front portion that may include a screen that slides to an open position to access a keyboard. Other mobile phones may have a front portion, such as sliding/articulating front portion 112, that articulates on hinges to expose a keyboard.

In order to provide a cover for both the back portion 110 and the sliding/articulating front portion 112, separate hard plastic shells, such as hard plastic front shell 102 and hard plastic back shell 108, can be utilized. However, plastic shells that attach directly to front and back portions of handheld electronic devices often do not provide a large amount of protection, especially against shocks from impacts. In addition, hard plastic shells may provide openings to operational features of the handheld electronic device that further reduces the protection provided by hard plastic shells.

As illustrated in FIG. 1, the hard plastic front shell 102 has a series of hooks, such as front shell hooks 146, 148, 150, and other front shell hooks (not shown), on opposing sides of the hard plastic front shell 102, that attach the hard plastic front shell 102 to the sliding/articulating front portion 112 of the sliding/articulating handheld electronic device 104.

The hard plastic front shell 102 may be constructed from thermoplastic polymers and has a hardness generally in the range of 65 to 120 on the Rockwell scale for HDPE, acrylic, PP, PVC, ABS, nylon, 10% GF PC. A narrower range of 105-115 on the Rockwell scale can be used for ABS and PC. These ranges are exemplary only and may vary with specific materials. The thermoplastic polymers can be molded, die cast or otherwise formed to a desired shape. Other materials can also be used for the hard shell, including metals that can be formed or machined to a desired shape.

The hard plastic front shell 102 may attach directly to the sliding/articulating front portion 112 of the sliding/articulating handheld electronic device 104. The hard plastic front shell may allow the sliding/articulating front portion 112 to slide or articulate between an open and closed position without interfering with the sliding/articulating motion provided by a sliding/articulating connector (not shown). The hard plastic front shell 102 may provide impact protection and may have an elevated surface that may protect the sliding/articulating front portion of the sliding/articulating handheld electronic device 104 from impacts.

As also illustrated in FIG. 1, a hard plastic back shell 108 has a plurality of back shell hooks 114, 116, 118, 120, 122, 124, 126, 128 that attach the hard plastic back shell 108 to the back portion 110 of the sliding/articulating handheld electronic device 104. Again, the manner in which the back shell hooks 114-128 attach to the back portion 110 of the sliding/articulating handheld electronic device 104 may not impede the operation of the sliding/articulating front portion 112 of the sliding/articulating handheld electronic device 104.

The hard plastic back shell 108 also has a plurality of back shell openings 152, 154, 156, 158, 160 that are aligned with electronic device operational features 174, including buttons and ports, in the sliding/articulating handheld electronic device 104. The electronic device operational features 174 include the operational features illustrated in FIG. 1, as well as the device buttons 186, 188, illustrated in FIG. 4, and other operational features that may exist on the sliding/articulating handheld electronic device 104. The hard plastic back shell 108 can be made from the same materials as the hard plastic front shell 102 with the same range of hardness.

As also illustrated in FIG. 1, a flexible silicone layer 106 is provided that is disposed in the hard plastic back shell 108. The density of the flexible silicone layer ranges from 50 Shore A to 60 Shore A, but may vary from 30 to 70 Shore A. In one embodiment, a range of 48-52 Shore A is used.

The flexible silicone layer 106 is molded to fit directly into, and to conform closely to, the hard plastic back shell 108. The flexible silicone layer 106 has a plurality of silicone layer openings 130, 132, 134, 136, 138, 140, 142, 144. Each of these silicone layer openings 130-144 is aligned with back shell hooks 114-128, respectively.

Each of the back shell hooks 114-128 is recessed inwardly from the outer edge of the hard plastic back shell 108 so as to engage the silicone layer openings 130-144. The back shell hooks 114-128 are inserted through the silicone layer openings 130-144 from the outside of the flexible silicone layer 106 and extend inwardly to the interior portion of the flexible silicone layer 106. In this fashion, the back shell hooks 114-128 are disposed inside of the flexible silicone layer 106, adjacent recessed portions, such as recessed portions 182, 184 in flexible silicone layer 106, which allows the back shell hooks 114-128 to engage the back portion 110 of the sliding/articulating handheld electronic device 104.

By inserting the recessed back shell hooks 114-128 through silicone layer openings 130-144, the back shell hooks 114-128 are hidden by the flexible silicone layer 106 and a clean and decorative appearance is provided from the outside of the hard plastic back shell 108. Also, since the back shell hooks 114-128 are recessed inwardly and the flexible silicone layer 106 is recessed outwardly, next to silicone layer openings 130-144, such as recessed portions 182, 184, there is little or no deflection of the flexible silicone layer 106 resulting from insertion of the back shell hooks, which further assists the combination of the hard plastic back shell 108 and the flexible silicone layer 106, to function as a single integrated unit.

Upon assembly, the hard plastic back shell 108 and the flexible silicone layer 106 may be securely married together as a result of the mechanical connection between the recessed back shell hooks 114-128 and the silicone layer openings 130-144, since the back shell hooks 114-128 are inserted through silicone layer openings 130-144. In this manner, the flexible silicone layer 106 appears to be part of the hard plastic back shell 108 and functions as a single integrated unit. As a result, the flexible silicone layer 106 can be made from a soft, flexible material that is more easily capable of absorbing shocks since deformation and movement of the flexible silicone layer 106 away from the hard plastic back shell 108 is substantially restricted.

The back shell openings 152-160 are aligned with various portions of the flexible silicone layer 106, as disclosed in more detail below. As also shown in FIG. 1, silicone layer operational features 180 are disposed in the flexible silicone layer 106 that are disposed in the back shell openings 152-160 when the flexible silicone layer 106 is married to the hard plastic back shell 108. The silicone layer operational features 180 generically refer to the various pads, portals, access panels and other operational features of the flexible silicone layer 106.

Figure 2:
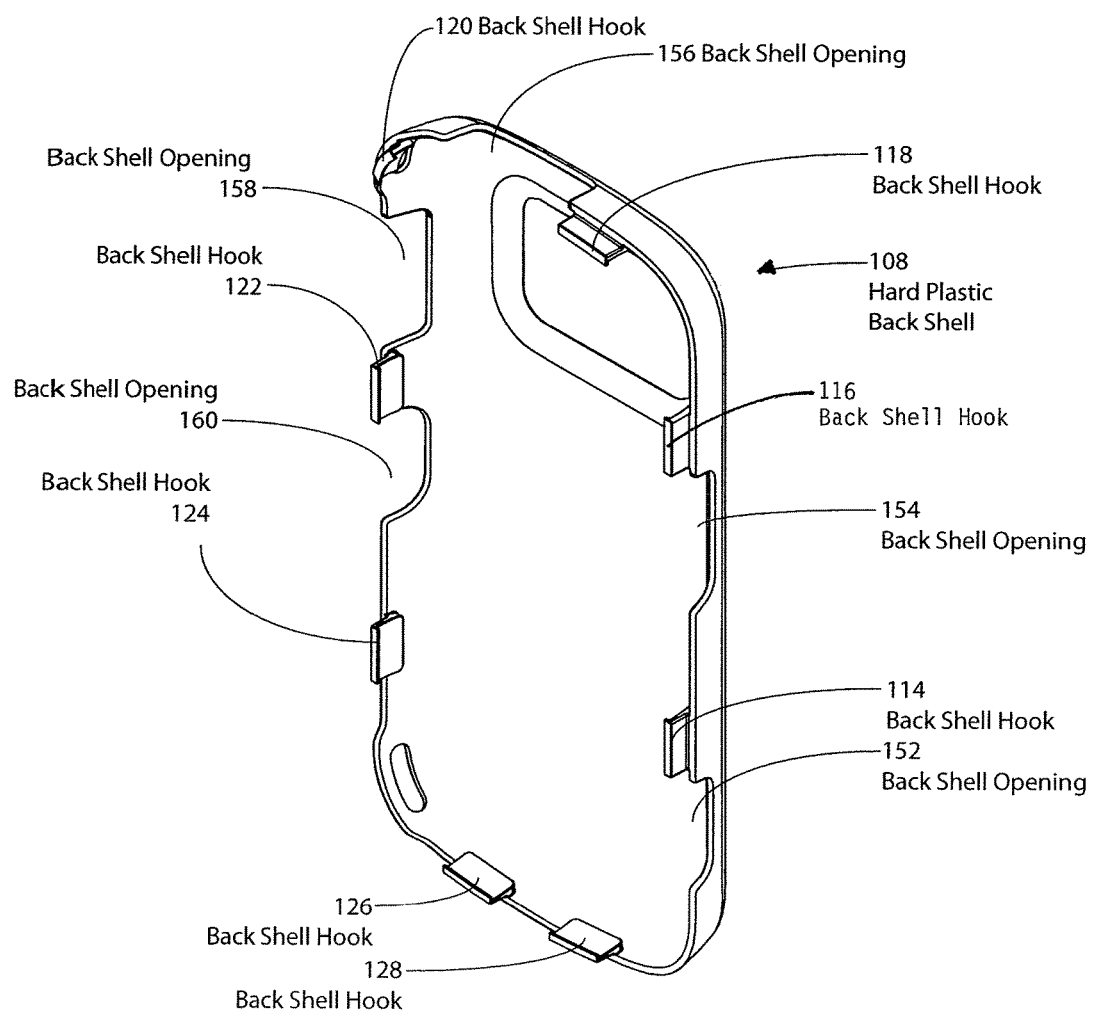
FIG. 2 is a perspective view of a hard plastic back shell of the embodiment of FIG. 1.

FIG. 2 is a schematic perspective view of the hard plastic back shell 108. As illustrated in FIG. 2, the hard plastic back shell 108 includes a plurality of back shell hooks 114-128 that are recessed from the outer surface of the hard plastic back shell 108. The back shell hooks 114-128 slide through the silicone layer openings 130-144 of flexible silicone layer 106 (FIG. 1) and are hidden by the flexible silicone layer 106. The silicone layer operational features 180 are disposed in the back shell openings 152-160, as disclosed in more detail below, to prevent the entry of dust, dirt and moisture.

Figure 3:
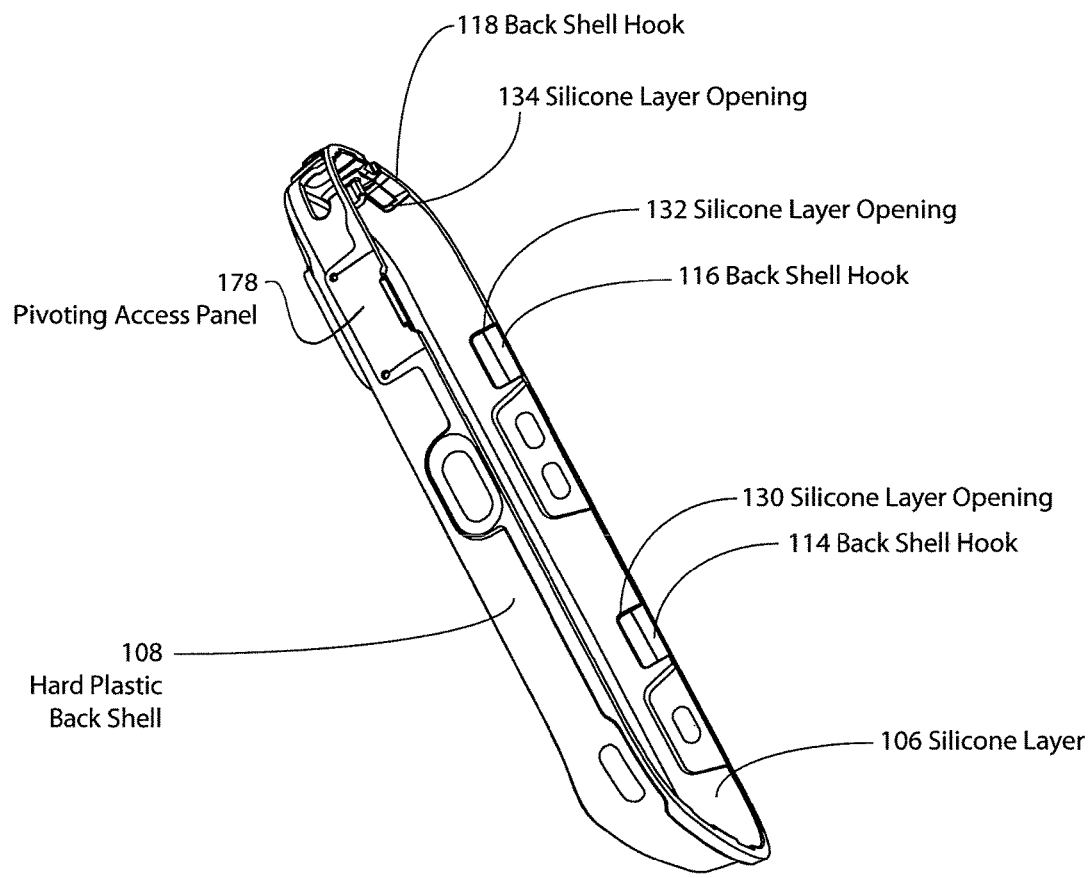
FIG. 3 is a perspective view of an assembled silicone layer and hard plastic back shell.

FIG. 3 is a schematic perspective view of the flexible silicone layer 106 disposed in the hard plastic back shell 108. As shown in FIG. 3, back shell hooks 114, 116, 118 are inserted through silicone layer openings 130, 132, 134 in the flexible silicone layer 106. Back shell hooks 114, 116, 118 are disposed on the interior portion of the flexible silicone layer 106 for attachment to the back portion 110 (FIG. 1) of the sliding/articulating handheld electronic device 104 (FIG. 1). Since the back shell hooks 114-118 are inserted through the silicone layer openings 130-134, back shell hooks 114-118 are not visible from the exterior of the hard plastic back shell 108.

For example, as illustrated in FIG. 3, back shell hooks 120, 122, 124, 126, 128 (FIGS. 1 and 2) are not visible since the flexible silicone layer 106 hides the back shell hooks 120-128, as illustrated in FIG. 3. In this manner, the flexible silicone layer 106 and hard plastic back shell 108 appear as a single integrated unit. Further, back shell hooks 114-128, when inserted through silicone layer openings 130-144, function to securely hold the flexible silicone layer 106 to the hard plastic back shell 108 so that the combined structure functions as a single integrated unit. FIG. 3 also includes a pivoting access panel 178, which provides access to a port on the back portion 110.

Figure 4:
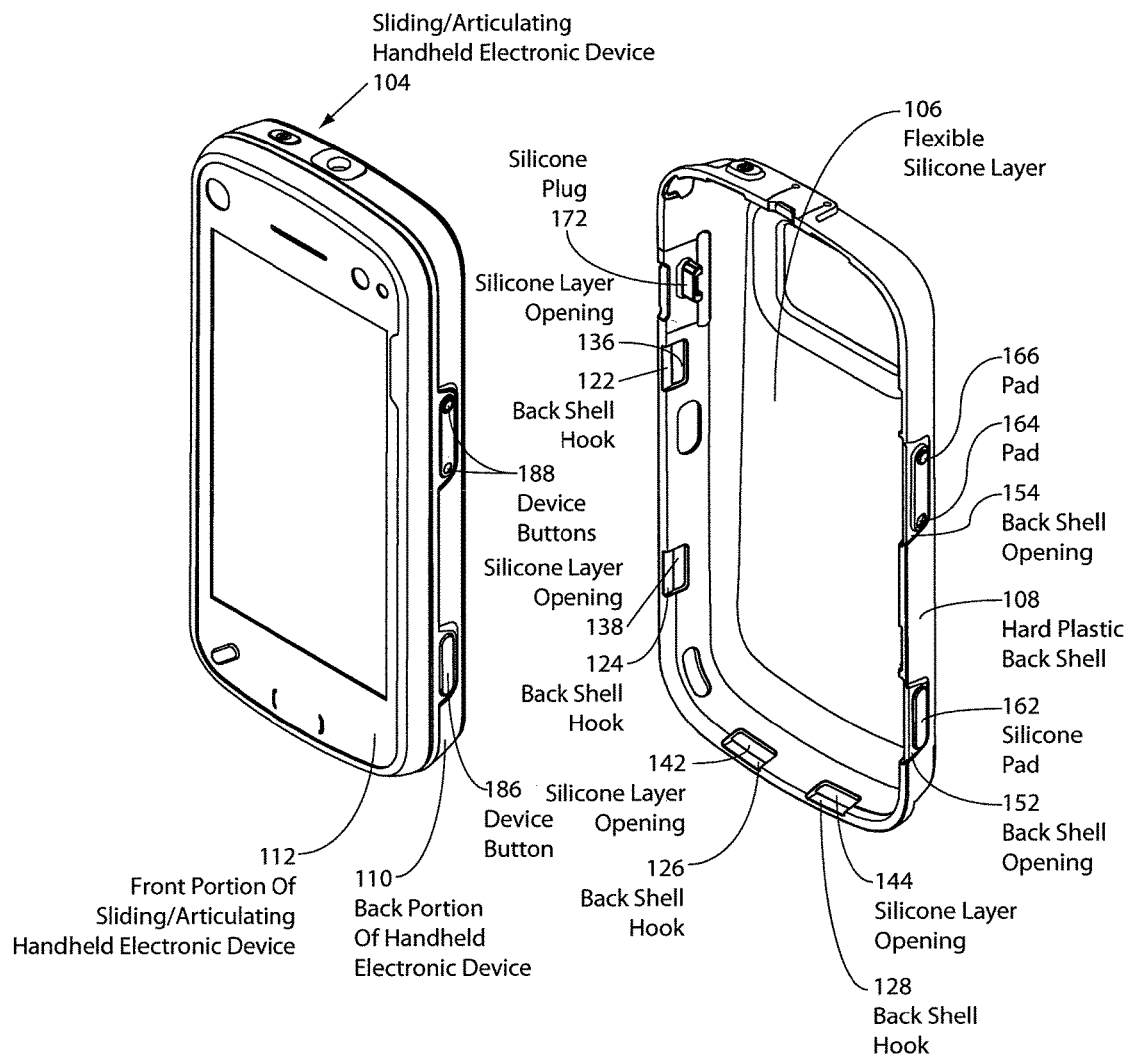
FIG. 4 is another perspective view of the assembled hard plastic back shell and silicone layer of the embodiment of FIG. 1, and the sliding/articulating handheld electronic device.

FIG. 4 is an exploded view of the sliding/articulating handheld electronic device 104 that is aligned with the flexible silicone layer 106, which is married to the hard plastic back shell 108. As shown in FIG. 4, silicone pad 162 is disposed in back shell opening 152. Similarly, silicone pads 164, 166 are disposed in the back shell opening 154. Silicone pads 162, 164, 166 comprise silicone layer operational features 180 (FIG. 1), as well as other operational features on the flexible silicone layer 106, such as device buttons 186, 188 that are disclosed in FIG. 1.

The silicone layer operational features 180 interact with electronic device operational features 174. Specifically, silicone pad 162 interacts with the device button 186, while silicone pads 164, 166 interact with device button 188. Another silicone layer operational feature 180 comprises the silicone plug 172 that is inserted in a jack (not shown) in the back portion 110 of the sliding/articulating handheld electronic device 104.

As also illustrated in FIG. 4, the back shell hook 122 extends through the silicone layer opening 136. Similarly, back shell hook 124 is inserted through the silicone layer opening 138. Back shell hook 126 is similarly inserted through silicone layer opening 142, while back shell hook 128 is inserted through silicone layer opening 144. Each of the back shell hooks 114-128 (FIGS. 1 and 4) attach to an inner surface of the back portion 110 of the sliding/articulating handheld electronic device 104 to securely hold the assembled flexible silicone layer 106 and hard plastic back shell 108 to the back portion 110 of the sliding/articulating handheld electronic device 104 without interfering with the sliding motion of the sliding/articulating front portion 112 (FIGS. 1 and 4) of the sliding/articulating handheld electronic device 104.

Figure 5:
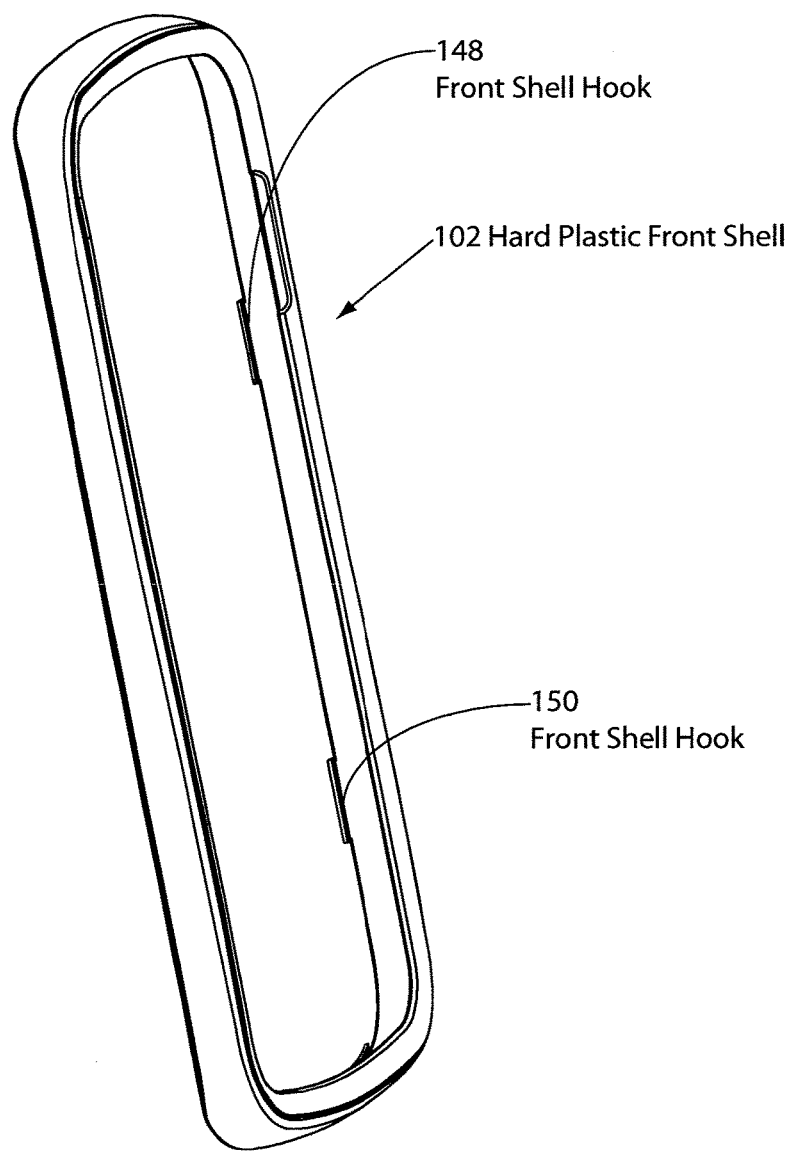
FIG. 5 is a perspective view of the hard plastic front shell of the embodiment of FIG. 1.

FIG. 5 is a schematic perspective view of the hard plastic front shell 102. As shown in FIG. 5, front shell hooks 148, 150, as well as other front shell hooks not illustrated in FIG. 5, securely attach to the sliding/articulating front portion 112 of the sliding/articulating handheld electronic device 104. The hard plastic front shell 102, as well as the front shell hooks, do not interfere with the sliding/articulating motion of the sliding/articulating front portion 112 of the sliding/articulating handheld electronic device 104.

Figure 6:
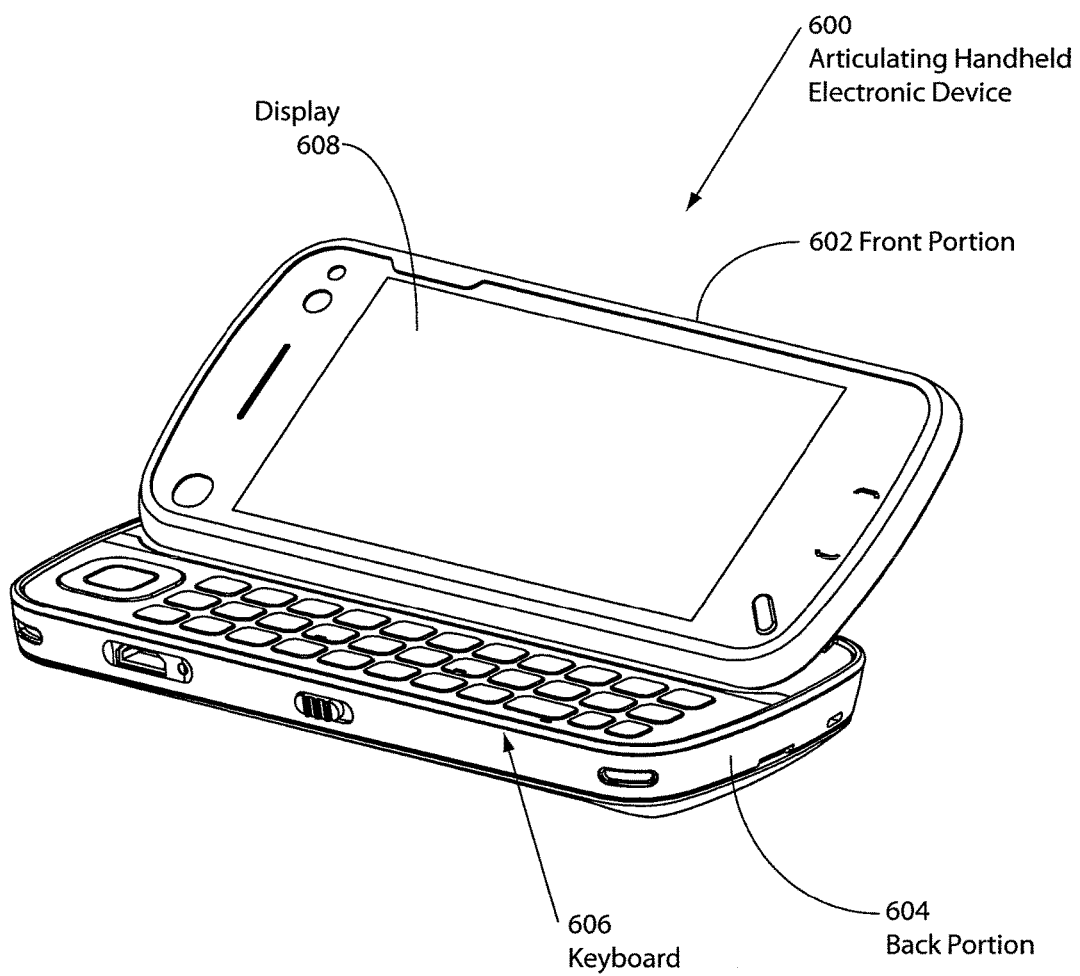
FIG. 6 is a perspective view of an embodiment of an articulating handheld electronic device.

FIG. 6 is a schematic perspective view of an articulating handheld electronic device 600. As shown in FIG. 6, the front portion 602 swivels away from the back portion 604 to expose a keyboard 606. The front portion, as illustrated in the embodiment of FIG. 6, includes a display 608 that is disposed at an angle to the back portion 604 and keyboard 606 to assist in viewing the information on display 608. The protective cover 100 (FIG. 1) is attached to the front portion 602 and back portion 604 in a manner that does not impede the articulating movement of the front portion 602.

Figure 7:
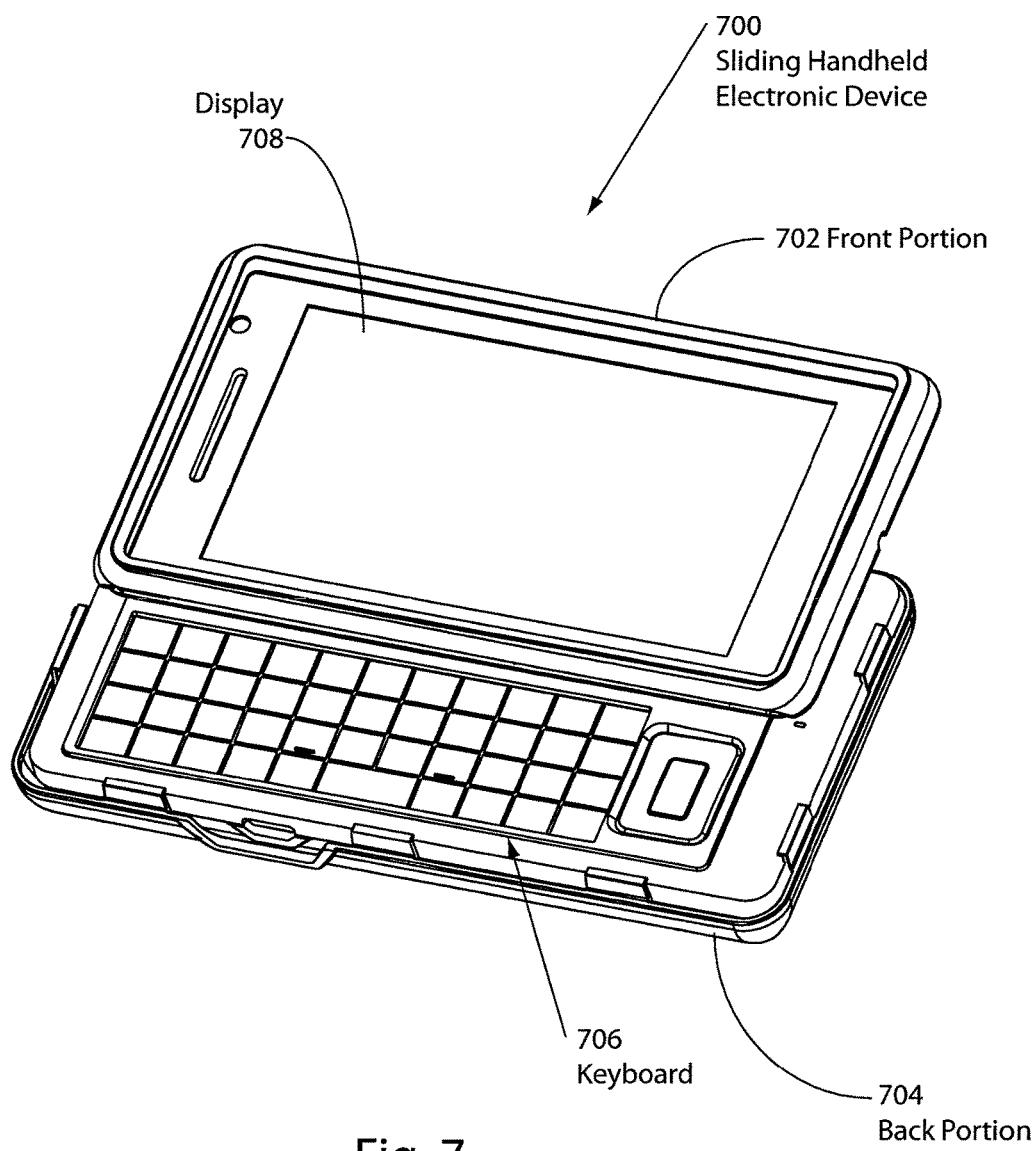
FIG. 7 is a perspective view of an embodiment of a sliding handheld electronic device.

FIG. 7 is a schematic perspective view of a sliding handheld electronic device 700. As shown in FIG. 7, a front portion 702 slides away from a back portion 704 to expose the keyboard 706. A hard plastic front shell, such as hard plastic front shell 102 (FIG. 1), attaches to the front portion 702 and does not interfere with the movement of the front portion 702 with regard to the back portion 704. Similarly, a hard plastic back shell and flexible silicone layer, such as hard plastic back shell 108 (FIG. 1) and flexible silicone layer 106 (FIG. 1), attach to the back portion 704 and do not interfere with the articulating movement of the front portion 702 of the sliding handheld electronic device 700.

Figure 8:
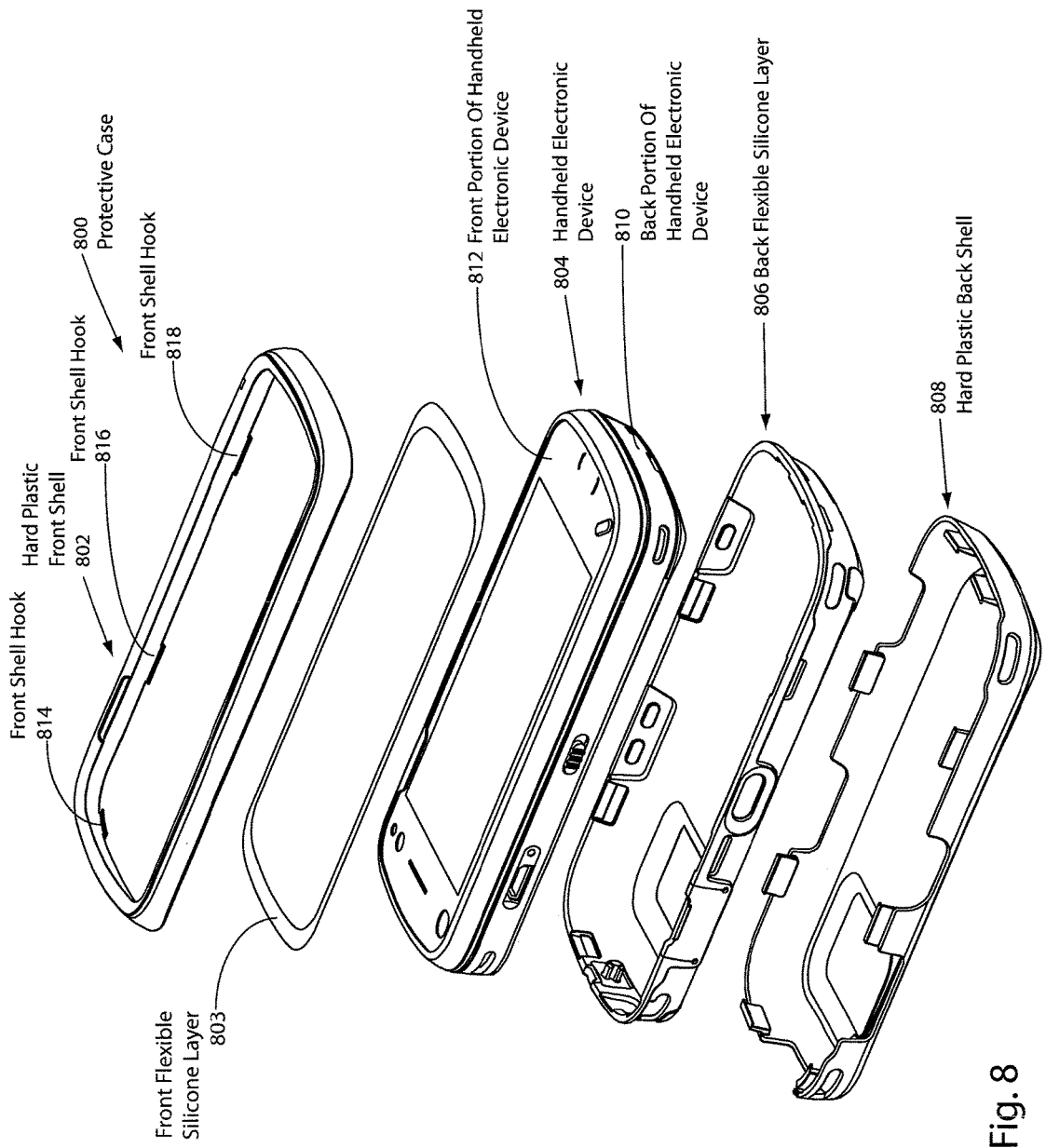
FIG. 8 is an exploded view of another embodiment of a protective case for a sliding/articulating handheld device.

FIG. 8 is an exploded view of another embodiment of a protective case 800 and a sliding/articulating handheld device 804. As illustrated in FIG. 8, a front flexible silicone layer 803 is disposed in hard plastic front shell 802. The combined structure is then attached to the front portion 812 of the handheld electronic device 804 with front shell hooks 814, 816, 818. The back flexible silicone layer 806 is disposed in the hard plastic back shell 808 and attaches to the back portion 810 of the handheld electronic device 804, in the same manner as disclosed with respect to FIG. 1.

The protective case 800 provides additional protection to the front portion 812 of the handheld electronic device 804 as a result of the use of the combined structure of the hard plastic front shell 802 and front flexible silicone layer 803. Hence, a flexible silicone layer is disposed under both the front plastic hard shell 802 and the hard plastic back shell 808 to provide additional protection to both the front portion 812 and the back portion 810 of the handheld electronic device 804.

Figure 9:
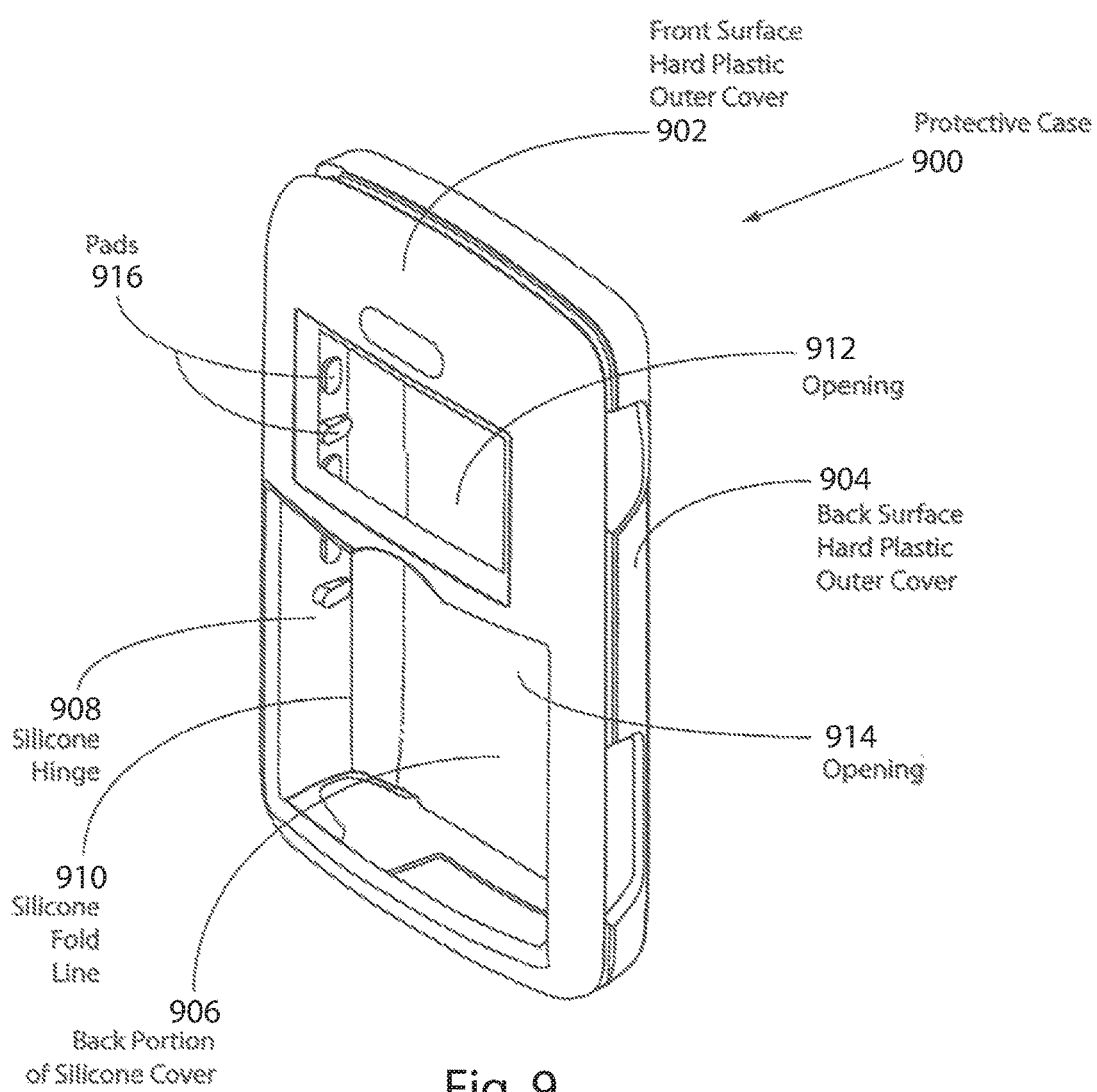
FIG. 9 is a schematic isometric view of an embodiment of a protective case that includes an integrated silicone hinge.

FIG. 9 is a schematic perspective view of an embodiment of a protective case 900 that may be used for a device with a hinge and where the flexible component of the protective case may cover or span the hinge area of the device.

As shown in FIG. 9, the protective cover 900 includes a front surface hard plastic outer cover 902 that snaps onto the front face of a handheld electronic device, such as a mobile phone. Similarly, a back surface hard plastic outer cover 904 snaps onto the back surface of the mobile phone, or other electronic device.

A silicone cover 922, that is soft and flexible, has a front portion 920 that is disposed in the interior portion of the front surface hard plastic outer cover 902 and a back portion 906 that is disposed in back surface hard plastic outer cover 904. A silicone hinge 908, that connects front and back portions of the silicone layer, is disposed between the front surface hard plastic cover 902 and the back surface hard plastic outer cover 904, and hinges along silicone fold line 910.

Figure 10:
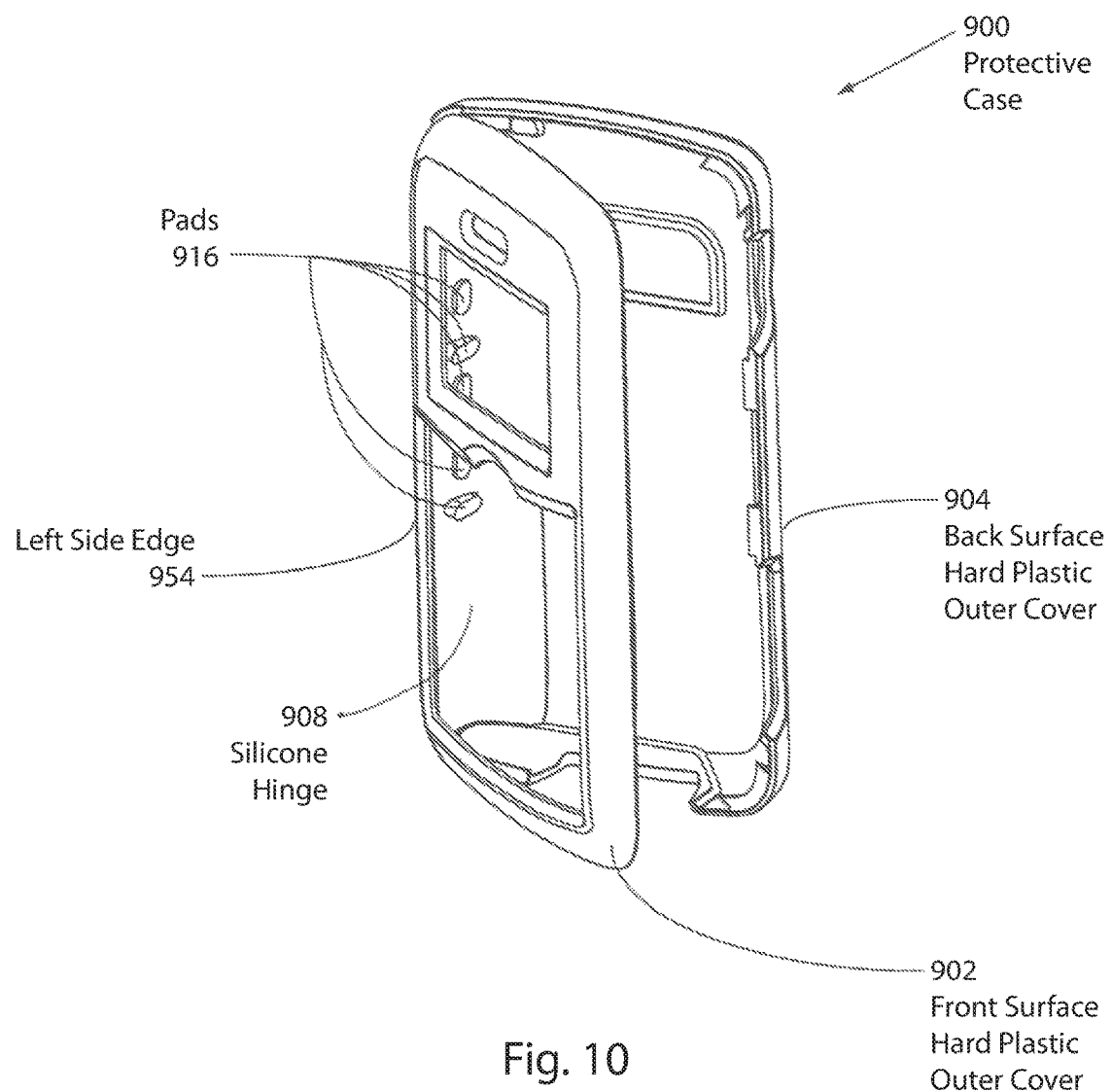
FIG. 10 is a schematic isometric view of an embodiment of a handheld electronic device.

FIG. 10 illustrates an example embodiment 900 that shows a protective cover in a partially open position. The protective cover may come in three parts: a front hard plastic cover 902, a back hard plastic cover 904, and a silicone hinge 908.

In some embodiments, the silicone hinge 908 may be a separate, removable piece that is installed first, then the front cover 902 and back cover 904 may be installed on top of the silicone hinge 908.

In other embodiments, the silicone hinge 908 may be molded to one or both of the front cover 902 and back cover 904. In such an embodiment, the silicone hinge 908 may be overmolded onto the back cover 904 and/or the front cover 902. Some embodiments may use a two-shot molding technique or a separate molding operation to mold the silicone hinge 908 onto one or both of the covers.

As shown in FIG. 10, the embodiment 900, has a hinge 952 that hinges along the left vertical side 954 of handheld electronic device 950. The embodiment 900 may be a protective cover for a cellular telephone or other handheld mobile device. Openings 912, 914, illustrated in FIG. 9, allow a user to view activity and enter information into the electronic device. As also shown in FIG. 9, the silicone hinge 908 may include pads 916 that assist the user in entering information into the side of the handheld electronic device. The silicone hinge 908 provides protection to the left side edge 954 of the handheld electronic device and allows information to be entered into the handheld electronic device through pads 916 on the left side edge 954 of the handheld electronic device, while the protective case 900 and the handheld electronic device are in a closed position.

In other words, the silicone hinge 908 allows access to buttons 958 (FIG. 10) on the side 954 of the handheld electronic device when the handheld electronic device and the protective case 900 are in a closed position, and the silicone hinge 908 provides protection to the side of the handheld electronic device adjacent to the silicone hinge 908. Additionally, the front surface hard plastic outer cover 902 and the back surface hard plastic outer cover 904 provide additional protection from impacts and help disperse impacts throughout the softer silicone layer 922 that is disposed under the hard plastic covers 902, 904.

Figure 11:
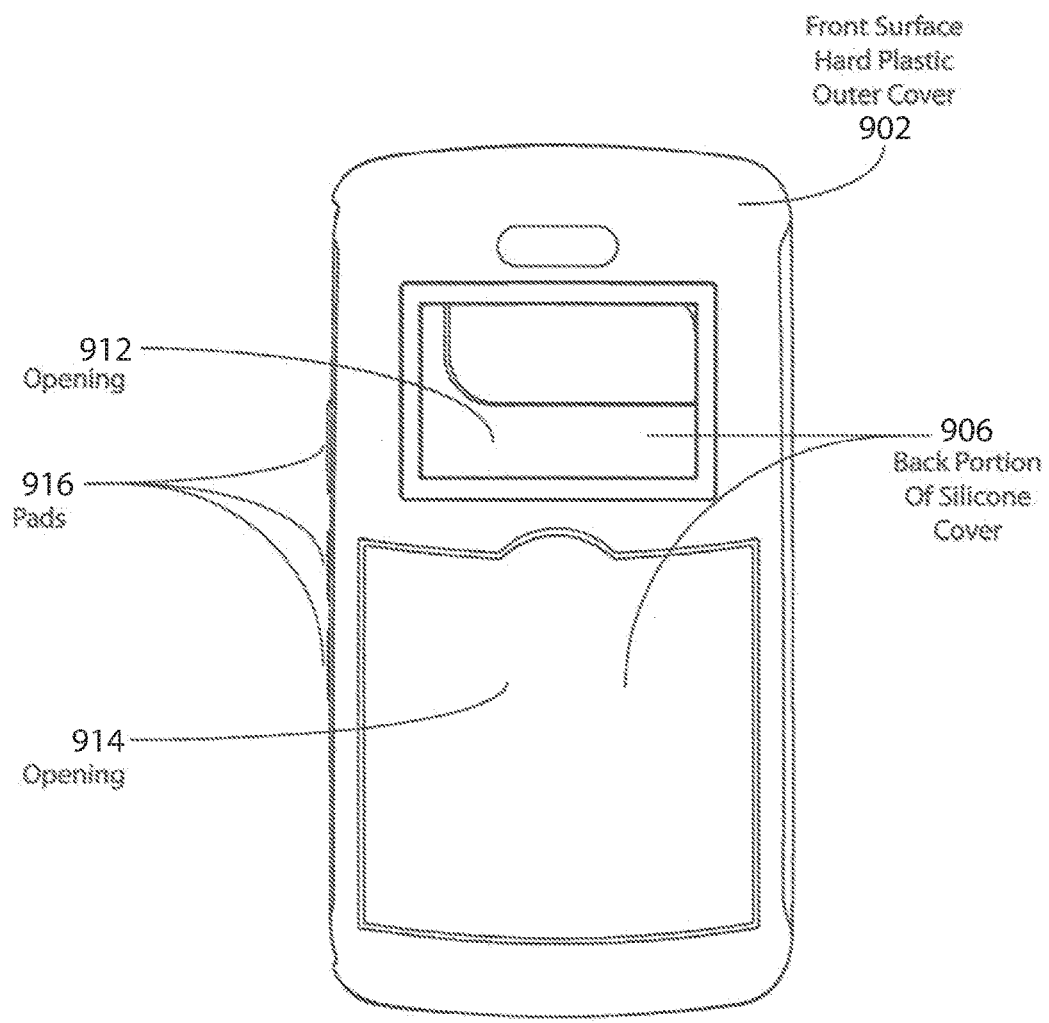
FIG. 11 is a front view of the embodiment of FIG. 9.

FIG. 11 is a front view of the embodiment of FIG. 9. As shown in FIG. 11, the front surface hard plastic outer cover 902 has openings 912, 914. The back portion 906 of the silicone inner cover 922 can be viewed through the openings 912, 914. In addition, pads 916 are shown as part of the silicone hinge 908 that interface with buttons 958 on the handheld electronic device that is disposed in the protective case 900.

Figure 12:
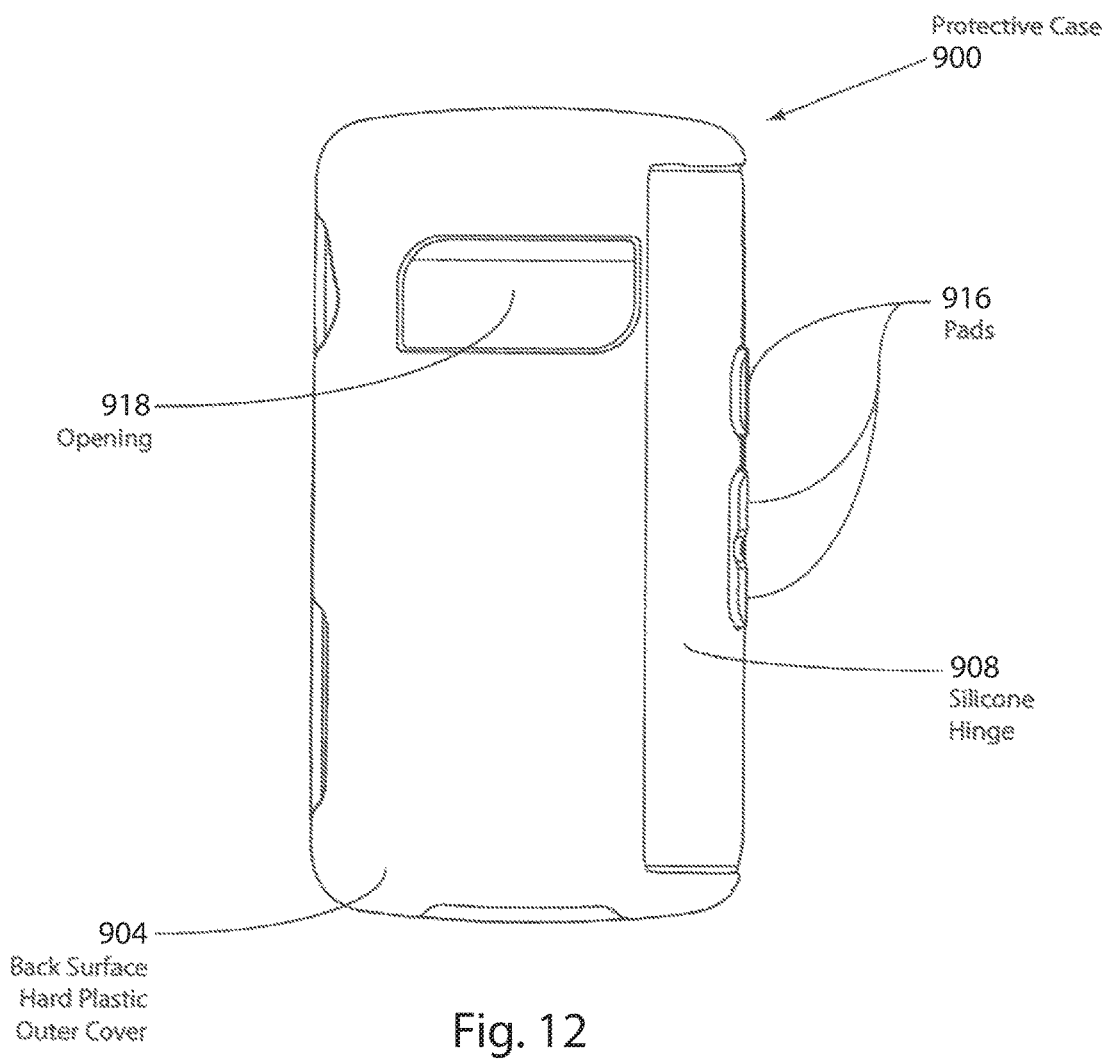
FIG. 12 is a back view of the embodiment of FIG. 9.

FIG. 12 is a back view of the protective case 900. As shown in FIG. 12, the back surface hard plastic outer cover 904 has an opening 918. The front portion 920 of the silicone inner cover 922 that is disposed in an inner portion of the front surface hard plastic outer cover 902 is visible through the opening 918. As also illustrated in FIG. 3, the back surface hard plastic outer layer 904 covers only a portion of the back surface, so that silicone hinge 908 is partially exposed. In this manner, silicone hinge 908 has a broad area to flex when the protective case 900 is in the open position.

Pads 916 allow activation of buttons 958 on the enclosed handheld electronic device while the protective case 900 is in the closed position. In this manner, the entire side of the enclosed electronic device is protected by the silicone hinge 908, while the pads 916 allow access to the enclosed handheld electronic device.

Figure 13:
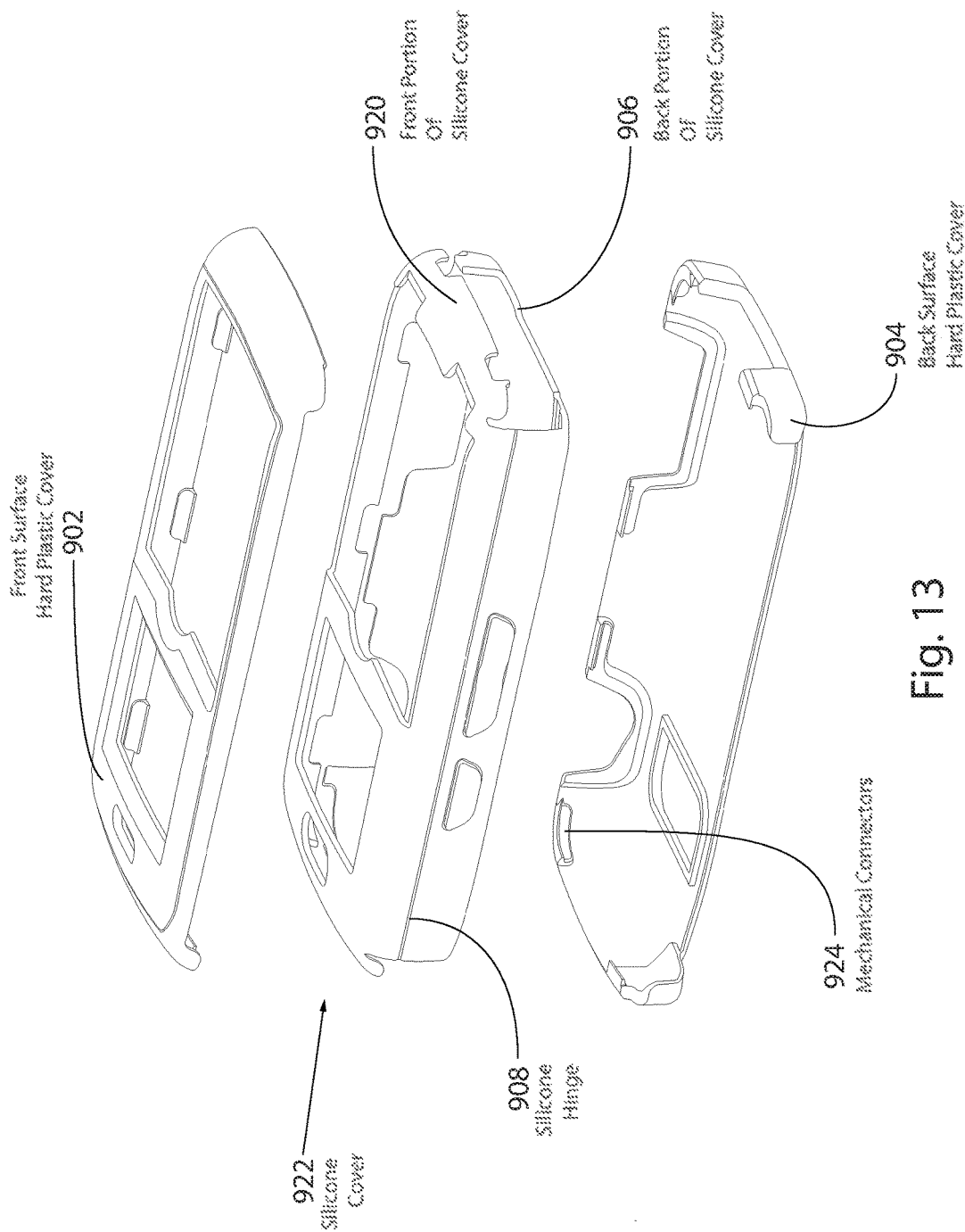
FIG. 13 is an exploded view of the three pieces of the embodiment of FIG. 9.

FIG. 13 is an exploded view of the three pieces of the embodiment of FIG. 9. As shown in FIG. 13, the front surface hard plastic shell 902 is aligned to cover the front portion of the silicone cover 920. The back surface hard plastic cover 904 is aligned to cover the back portion 906 of the silicone cover 922. The silicone hinge 908 connects the front portion 922 to the back portion 906 of the silicone cover 922.

Mechanical connectors 924 illustrate the manner in which the back surface hard plastic cover 904 attaches to the back portion 956 (FIG. 10) of the handheld electronic device. Similarly, front surface hard plastic shell 902 includes similar mechanical connectors (not shown) that connect the front surface hard plastic shell 902 to the front portion 960 (FIG. 10) of the handheld electronic device.

As illustrated in FIG. 13, the silicone cover 922 is a continuous cover that is disposed within the front surface hard plastic cover 902 and the back surface hard plastic cover 904, and extends around the side of the handheld electronic device to provide protection to the front, back and side portions of the handheld electronic device. In this manner, protection is not only provided to the front and back faces, but also at the location where the handheld electronic device 950 hinges, as illustrated in FIG. 10, with a continuous silicone cover.

As disclosed above, the connecting silicone hinge 908 includes pads 916 (FIG. 9) that allow activation of buttons 958 (FIG. 10), while the protective case 900 is in a closed position. In this manner, the silicone cover 922 provides protection to the handheld electronic device and allows activation of buttons in the hinge area of the handheld electronic device. Further, the combination of the hard plastic covers 902, 904 that surround the softer silicone cover 922 provides a substantial amount of protection to the handheld electronic device that is not available from either the use of just a silicone cover or hard plastic covers.

The hard plastic covers 902, 904 protect the handheld electronic device from sharp impacts. The shock of hard impacts is spread along the surface of the hard plastic outer covers 902, 904, and is absorbed by the silicone cover 922. In this manner, the combination of the hard plastic covers 902, 904 and the silicone cover 922 provides both protection and accessibility that has not been available to hinged type of handheld electronic devices, such as flip phones.

Although the embodiment 900 is shown as a handheld electronic device that pivots along a side portion, a silicone hinge can also be provided on a top portion of a protective cover for handheld electronic devices that hinge along a top portion. Further, a silicone hinge can be provided along a bottom portion of the protective cover for handheld electronic devices that hinge along a bottom portion. Of course, the silicone hinge can be employed on either side of the protective cover, depending upon which side the electronic device hinges.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A case for protecting a portable electronic device, the portable electronic device comprising at least a first portion and a second portion, the second portion of the portable electronic device hingedly attached to the first portion with a hinging portion such that the second portion of the portable electronic device is permitted to articulate relative to the first portion, each of the first and second portions of the portable electronic device, respectively, having an outer surface and a display screen area, the case comprising:

a first member removably attachable to the first portion of the portable electronic device for covering at least a portion of the outer surface of the first portion of the portable electronic device while not covering the display screen area of the first portion of the portable electronic device, wherein the first member includes a cushion layer and a hard shell layer, wherein the cushion layer is disposed in and conforms to the hard shell layer;

a second member removably attachable to the second portion of the portable electronic device for covering at least a portion of the outer surface of the second portion of the portable electronic device while not covering the display screen area of the second portion of the portable electronic device, wherein the second member includes a cushion layer and a hard shell layer, wherein the cushion layer is disposed in and conforms to the hard shell layer; and a flexible hinge member through which the first member is indirectly attached to the second member, wherein the flexible hinge member is in proximity to the hinging portion of the portable electronic device when the first and the second members of the case are attached to the first and second portions of the portable electronic device, respectively, the flexible hinge member permitting articulation of the portable electronic device when the case is attached to the portable electronic device due to flexing of an elastomeric material that comprises the flexible hinge member, and wherein the flexible hinge member, the cushion layer of the first member, and the cushion layer of the second member are formed from a single continuous piece of the elastomeric material that extends between the hard shell layers and the respective portions of the portable electronic device when the case is attached to the portable electronic device.

2. The case of claim 1 wherein at least one of the first and the second members of the case includes an opening providing operational access to one or more buttons of the portable electronic device when the case is installed on the portable electronic device.

3. The case of claim 1 wherein the flexible hinge member is comolded with at least one of the first member and the second member.

4. The case of claim 1 wherein the flexible hinge member protects at least a portion of the hinging member of the portable electronic device when the protective cover is installed on the portable electronic device.

5. The case of claim 1 wherein the flexible hinge member includes a button pad for actuating a button of the installed portable electronic device through the button pad from the outer surface of the case.

6. The case of claim 1 wherein the flexible hinge member includes one or more fold lines at which the flexible hinge member flexes to allow the second member of the case to articulate relative to the first member.

7. The case of claim 1 wherein each of the first member and the second member contain one or more hooks for removably attaching to the respective portion of the portable electronic device.

8. A protective cover for protecting a foldable portable electronic device having a display, the portable electronic device comprising at least a first portion and a second portion, wherein the second portion of the portable electronic device articulates relative to the first portion of the portable electronic device, each of the first and second portions of the portable electronic device having a display portion and an outer surface, the protective cover comprising:

a first member removably attachable to at least the outer surface of the first portion of the portable electronic device for covering at least a portion of the outer surface of the first portion of the portable electronic device while not covering the display portion of the first portion of the portable electronic device; and a second member removably attachable to at least the outer surface of the second portion of the portable electronic device for covering at least a portion of the outer surface of the second portion of the portable electronic device while not covering the display portion of the second portion of the portable electronic device, wherein the second member of the protective cover is indirectly attached to the first member of the protective cover through a flexible hinge member of the protective cover, the flexible hinge member permitting articulation of the first member and the first portion of the portable electronic device relative to the second member and the second portion of the portable electronic device when the protective cover is attached to the portable electronic device, wherein the first member and the second member each include a cushion layer that conforms to an interior surface of a hard shell, wherein the hard shell is formed from a different material than the cushion layer, and wherein the flexible hinge member, the cushion layer of the first member, and the cushion layer of the second member are formed from a single continuous piece of elastomeric material that extends between the hard shells and the respective portions of the portable electronic device when the protective cover is attached to the portable electronic device.

9. The protective cover of claim 8 wherein the flexible hinge member includes one or more button pads for actuating a button of the installed portable electronic device from an exterior surface of the flexible hinge member.

10. The protective cover of claim 8 wherein at least one of the first member and the second member contain one or more hooks for removably attaching to the portable electronic device.

11. The protective cover of claim 8 wherein the flexible hinge member includes one or more fold lines at which the flexible hinge member flexes to allow the second member of the protective cover to articulate relative to the first member.

12. The protective cover of claim 8 wherein at least one of the first and the second members includes an opening providing access to a button of the portable electronic device when the protective cover is installed on the portable electronic device.

13. A protective case for protecting a portable electronic device, the portable electronic device comprising at least a first portion and a second portion, wherein the second portion of the portable electronic device is movably attached to the first portion of the portable electronic device such that the second portion of the portable electronic device is movable relative to the first portion, each of the first and second portions of the portable electronic device, respectively, having a housing and a display portion, the protective case comprising:
a first member removably attachable to the first portion of the portable electronic device for covering and protecting at least a portion of the housing of the first portion of the portable electronic device; and
a second member removably attachable to the second portion of the portable electronic device for covering and protecting at least a portion of the housing of the second portion of the portable electronic device, wherein each of the first member and the second member each include a rigid outer shell and a cushion layer, wherein the second member of the protective case is movably attached to the first member of the protective case through a flexible hinge member formed from an elastomeric material that is different than a material of the rigid outer shell, wherein the flexible hinge member is in proximity to the portable electronic device when the first and the second members of the protective case are removably attached to the respective housings of the portable electronic device, and wherein the flexible hinge member and the cushion layers are formed from a single continuous piece of the elastomeric material that extends between the rigid outer shells and the respective housing portions of the portable electronic device when the protective case is attached to the portable electronic device, the protective case permitting movement of the first member and the first portion of the portable electronic device relative to the second member and the second portion of the portable electronic device when the protective case is attached to the portable electronic device.

14. The protective case of claim 13 wherein at least one of the first member and the second member contain one or more hooks for removably attaching to the respective portion of the portable electronic device.

15. The protective case of claim 13 further including one or more button pads for actuating a button of the installed portable electronic device from an exterior surface of the protective case.

16. The protective case of claim 13 wherein one of the first member and the second member include an opening providing optical access to the installed portable electronic device.

17. The protective cover of claim 8 wherein one of the first member and the second member includes an opening providing optical access to a second display portion of a respective one of the first and second portions of the portable electronic device.

18. The protective case of claim 13 wherein one of the first member and the second member includes a pivoting access panel for selectively accessing a portion of the attached portable electronic device.

* * * * *